(12) United States Patent
Chen et al.

(10) Patent No.: US 10,129,988 B2
(45) Date of Patent: Nov. 13, 2018

(54) DISPLAY PANEL COMPRISING A PLURALITY OF PERIPHERAL WIRES HAVING FAN-OUT PORTIONS DISPOSED ON SIDE SURFACES OF FIRST AND SECOND SUBSTRATES

(71) Applicant: AU OPTRONICS CORPORATION, Hsin-chu (TW)

(72) Inventors: Kuan-Hsun Chen, Hsin-chu (TW); Hao-An Chuang, Hsin-chu (TW); Hui-Di Lu, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/801,957

(22) Filed: Nov. 2, 2017

(65) Prior Publication Data

US 2018/0263123 A1    Sep. 13, 2018

(30) Foreign Application Priority Data

Mar. 9, 2017   (TW) .............................. 106107838 A

(51) Int. Cl.
*H05K 5/00* (2006.01)
*H05K 1/18* (2006.01)
(Continued)

(52) U.S. Cl.
CPC ........... *H05K 5/0017* (2013.01); *H05K 1/111* (2013.01); *H05K 1/181* (2013.01)

(58) Field of Classification Search
CPC ...... G02F 1/0121; G02F 1/0327; G02F 1/076; G02F 1/133; G02F 2001/133612; G02F 2001/13456; H01L 23/49572; H01L 2224/50; H01L 2224/79; H01L 2224/86; H01L 2225/06579; G09G 2290/00
See application file for complete search history.

(56) References Cited

U.S. PATENT DOCUMENTS 7,629,735 B2   12/2009  Ryu
2002/0140654 A1 *  10/2002  Kim ..................... G02F 1/13452
                                                            345/87
(Continued)

FOREIGN PATENT DOCUMENTS

CN          105223747 A       1/2016

*Primary Examiner* — Paul Lee
(74) *Attorney, Agent, or Firm* — Tim Tingkang Xia, Esq.; Locke Lord LLP

(57) ABSTRACT

A display panel includes a first substrate, a second substrate, a display medium layer, first peripheral wires, and second peripheral wires. The first substrate has at least one first side surface. The second substrate is disposed opposite to the first substrate, and has at least one second side surface adjacent to the first side surface. Each first peripheral wire includes a first signal line, a first fan-out portion, and a first pad. The first signal lines are disposed between the first substrate and the second substrate, and the first fan-out portions are disposed on the first side surface of the first substrate. Each second peripheral wire includes a second signal line, a second fan-out portion, and a second pad. The second signal lines are disposed between the first substrate and the second substrate, and the second fan-out portions are disposed on the second side surface of the second substrate.

19 Claims, 12 Drawing Sheets

(51) Int. Cl.
*H05K 1/11* (2006.01)
*G02F 1/133* (2006.01)
*G02F 1/1345* (2006.01)

(56) References Cited

U.S. PATENT DOCUMENTS

| | | | | |
|---|---|---|---|---|
| 2009/0033609 | A1* | 2/2009 | Ashizawa | G02F 1/1345 345/92 |
| 2009/0195996 | A1* | 8/2009 | Isono | H05K 9/0054 361/751 |
| 2010/0026952 | A1* | 2/2010 | Miura | G02F 1/133305 349/150 |
| 2011/0051068 | A1* | 3/2011 | Kamon | G02F 1/13452 349/152 |
| 2012/0146972 | A1* | 6/2012 | Fujikawa | G02F 1/13452 345/206 |
| 2013/0207933 | A1* | 8/2013 | Mamba | G06F 3/046 345/174 |
| 2014/0132873 | A1* | 5/2014 | Ogasawara | G02F 1/13452 349/43 |
| 2015/0179670 | A1 | 6/2015 | Kang et al. | |
| 2015/0301372 | A1* | 10/2015 | Mori | G02F 1/1339 349/33 |
| 2015/0301420 | A1* | 10/2015 | Yoshida | G02F 1/1345 257/43 |
| 2016/0178974 | A1* | 6/2016 | Li | G02F 1/134336 345/174 |

* cited by examiner

DISPLAY PANEL COMPRISING A PLURALITY OF PERIPHERAL WIRES HAVING FAN-OUT PORTIONS DISPOSED ON SIDE SURFACES OF FIRST AND SECOND SUBSTRATES

CROSS-REFERENCE TO RELATED PATENT APPLICATION

This application claims priority to and the benefit of, pursuant to 35 U.S.C. § 119(a), patent application Serial No. 106107838 filed in Taiwan on Mar. 9, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a display panel, and particularly to a display panel having a narrow bezel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, matured photoelectric technologies and semiconductor manufacturing technologies promote the development of display panel technologies. Display panels include liquid crystal display panels, organic electroluminescent display panels, and the like. Generally, a display panel has a display region, an external circuit region outside the display region, and a wiring region located between the display region and the external circuit region. There are multiple pixel structures arranged in an array in the display region, and there are a circuit contact and a driving circuit in the external circuit region. There are multiple wires in the non-display regions. The wires are configured to electrically connect the pixel structures to the driving circuit, or electrically connect the pixel structures to an external circuit, so as to receive a control signal to display.

Currently, display devices are developed towards narrow bezels. Requirements of users on image quality become higher and higher, and a resolution of an image also becomes higher and higher, so a quantity of wires disposed in a peripheral circuit region is also bound to increase, and it is difficult to meet a design requirement of a narrow bezel. Consequently, how to consider both quality of a display image and the design requirement of the narrow bezel is an objective to be urgently pursued by a person skilled in the art.

SUMMARY

The present invention provides a display panel, including a first substrate, a second substrate, a display medium layer, a plurality of first peripheral wires, and a plurality of second peripheral wires. The first substrate has at least one first side surface. The second substrate is disposed opposite to the first substrate, and has at least one second side surface adjacent to the first side surface. The display medium layer is disposed between the first substrate and the second substrate. Each of the first peripheral wires includes a first signal line, a first fan-out portion, and a first pad. The first fan-out portions are electrically connected to the first signal lines and the first pads. The first signal lines are disposed between the first substrate and the second substrate, and the first fan-out portions are disposed on the first side surface of the first substrate. Each of the second peripheral wires includes a second signal line, a second fan-out portion, and a second pad. The second fan-out portions are electrically connected to the second signal lines and the second pads. The second signal lines are disposed between the first substrate and the second substrate, and the second fan-out portions are disposed on the second side surface of the second substrate.

According to an embodiment of the invention, at least one of the first signal lines is disposed between two adjacent second signal lines.

According to an embodiment of the invention, the first signal lines and the second signal lines are alternately arranged.

According to an embodiment of the invention, the first peripheral wires are divided into a plurality of first wire groups, and each of the first wire groups has at least two of the first peripheral wires. The second peripheral wires are divided into a plurality of second wire groups, and each of the second wire groups has at least two of the second peripheral wires. The first wire groups and the second wire groups are alternately arranged.

According to an embodiment of the invention, the first signal lines of the first peripheral wires in each of the first wire groups are spaced at equal distances, and the second signal lines of the second peripheral wires in each of the second wire groups are spaced at equal distances.

According to an embodiment of the invention, a quantity of the first peripheral wires in each of the first wire groups is the same as a quantity of the second peripheral wires in each of the second wire groups.

According to an embodiment of the invention, the first signal lines and the second signal lines are spaced apart from each other at equal distances.

According to an embodiment of the invention, the first pads have equal distances between each other.

According to an embodiment of the invention, each of the first fan-out portions has a first end and a second end, the first end of each of the first fan-out portions is connected to the corresponding first signal line, and the second end of each of the first fan-out portions is connected to the corresponding first pad. A distance between the first ends of two adjacent first fan-out portions is greater than a distance between the second ends of the two adjacent first fan-out portions. Each of the second fan-out portions has a first end and a second end, the first end of each of the second fan-out portions is connected to the corresponding second signal line, and the second end of each of the second fan-out portions is connected to the corresponding second pad. A distance between the first ends of two adjacent second fan-out portions is greater than a distance between the second ends of the two adjacent first fan-out portions.

According to an embodiment of the invention, the first pads are disposed on the first side surface of the first substrate.

According to an embodiment of the invention, the second pads are disposed on the second side surface of the second substrate.

According to an embodiment of the invention, the first substrate and the second substrate respectively have a first surface and a second surface. The display medium layer is disposed between the first surface of the first substrate and the first surface of the second substrate, and the first pads are disposed on the second surface of the first substrate.

According to an embodiment of the invention, the second pads are disposed on the second surface of the second substrate.

According to an embodiment of the invention, the display panel further includes a sealant, disposed between the first substrate and the second substrate, and located around the display medium layer. The first signal lines and the second signal lines are disposed between the sealant and the first substrate.

According to an embodiment of the invention, the second fan-out portions are further disposed on the sealant.

According to an embodiment of the invention, the display panel further includes at least one driving circuit element, electrically connected to the first pads and the second pads.

According to an embodiment of the invention, the driving circuit element includes a circuit board and a driving chip. The circuit board includes a plurality of connection wires, and electrically connected to the first pads and the second pads respectively. The driving chip is electrically connected to the connection wires of the circuit board.

According to an embodiment of the invention, the display panel further includes a first driving circuit element and a second driving circuit element. The first driving circuit element is electrically connected to the first pads. The second driving circuit element is electrically connected to the second pads.

According to an embodiment of the invention, the display panel further includes an insulation layer, disposed on the first fan-out portions of the first peripheral wires and disposed on the second fan-out portions of the second peripheral wires.

For the display panel according to the embodiments, the fan-out portions of the peripheral wires are disposed on the first side surface and the second side surface, so as to achieve an effect of a narrow bezel. In addition, because the first fan-out portions and the second fan-out portions are separately disposed on the first side surface of the first substrate and the second side surface of the second substrate that have limited thicknesses, a layout area of the first fan-out portions and the second fan-out portions may be reduced.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The following discloses a plurality of implementation manners of the present invention with reference to the accompanying drawings. For clarity, the following describes details of many practices. However, it should be understood that the details of the practices do not limit the present invention. That is, in some implementation manners of the present invention, the details of the practices are unnecessary. In addition, to simplify the accompanying drawings, some conventional structures and elements are shown in a simplified schematic manner in the accompanying drawings.

Figure 1A:
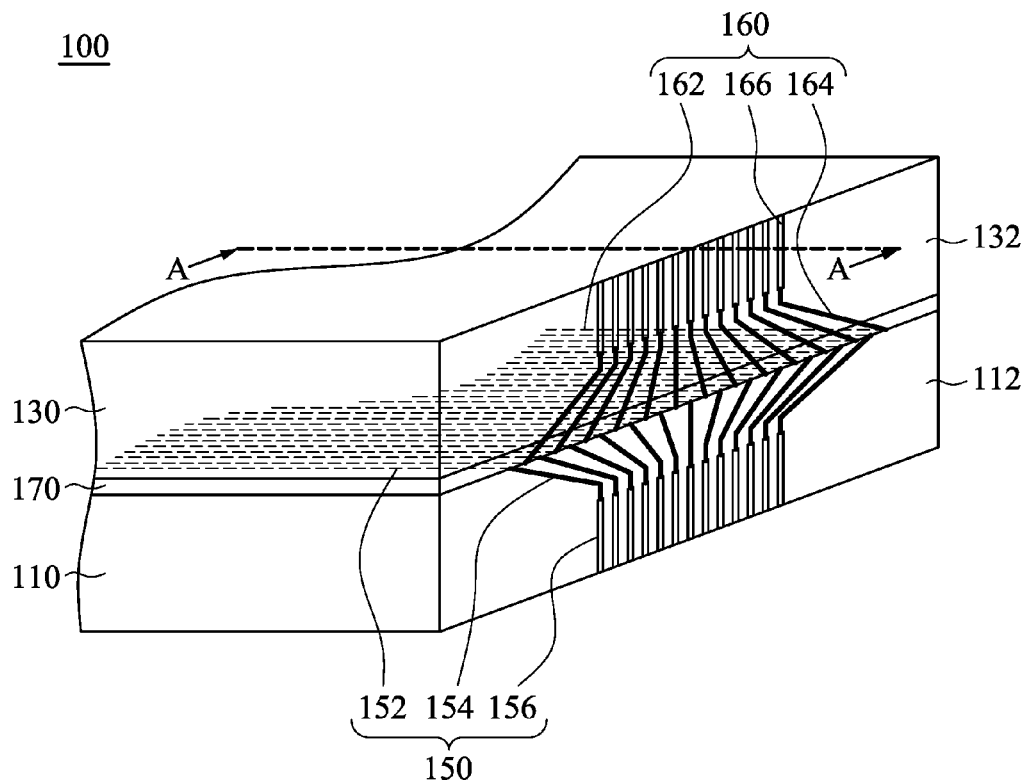
FIG. 1A is a partial three-dimensional view of a display panel according to an embodiment of the present invention.
Figure 1B:
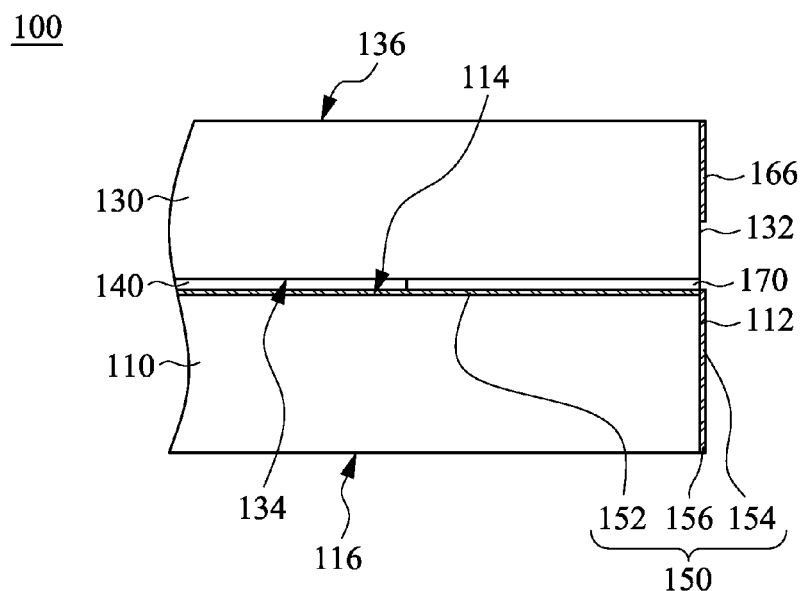
FIG. 1B is a cross section chart along a line segment A-A in FIG. 1A.
Figure 2:
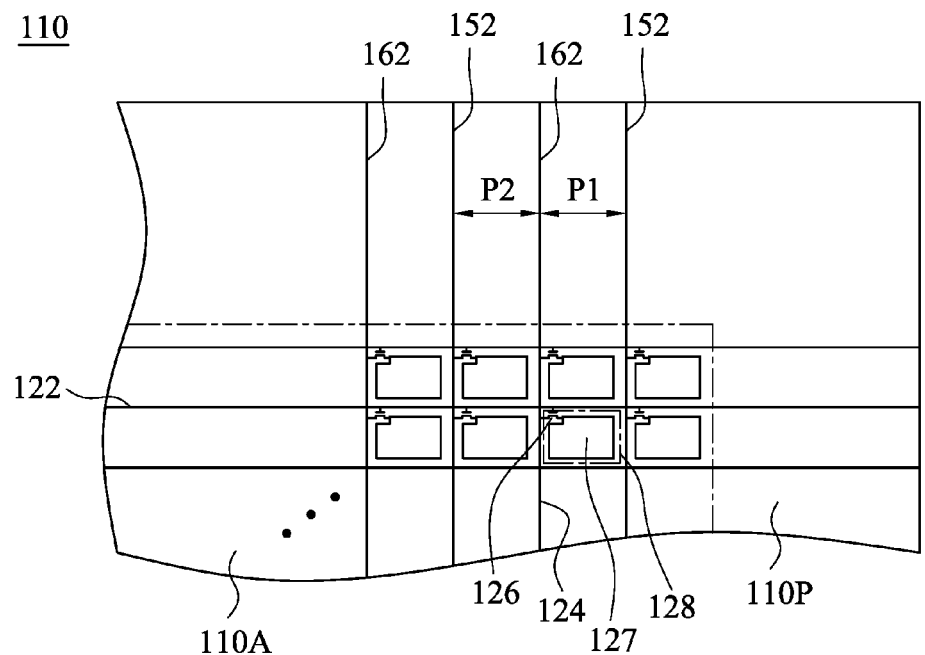
FIG. 2 is a partial top view of a first substrate in FIG. 1A.

FIG. 1A is a partial three-dimensional view of a display panel 100 according to an embodiment of the present invention, FIG. 1B is a cross section chart along a line segment A-A in FIG. 1A, and FIG. 2 is a partial top view of a first substrate 110 in FIG. 1A. The display panel 100 includes the first substrate 110, a second substrate 130, and a display medium layer 140. The first substrate 110 has at least one first side surface 112. The second substrate 130 is disposed opposite to the first substrate 110, and has at least one second side surface 132 adjacent to the first side surface 112. That is, the second side surface 132 is a side surface of the second substrate 130 that is closest to the first side surface 112 of the first substrate 110. For example, in FIG. 1A, the second side surface 132 is disposed above the first side surface 112, and the first side surface 112 and the second side surface 132 face the same direction. More specifically, the first side surface 112 and the second side surface 132 are extended in the thickness direction of first substrate 110 and/or the second substrate 130. The display medium layer 140 is disposed between the first substrate 110 and the second substrate 130. More specifically, the first substrate 110 has a first surface 114 and a second surface 116 that are opposite to each other, the second substrate 130 has a first surface 134 and a second surface 136 that are opposite to each other, and the display medium layer 140 is disposed between the first surface 114 of the first substrate 110 and the first surface 134 of the second substrate 130.

The display panel 100 further includes a plurality of first peripheral wires 150 and a plurality of second peripheral wires 160. Each of the first peripheral wires 150 includes a first signal line 152, a first fan-out portion 154, and a first pad 156. The first fan-out portions 154 are electrically connected to the first signal lines 152 and the first pads 156. The first signal lines 152 of the first peripheral wires 150 are disposed between the first substrate 110 and the second substrate 130, and the first fan-out portions 154 are disposed on the first side surface 112 of the first substrate 110. Each of the second peripheral wires 160 includes a second signal line 162, a second fan-out portion 164, and a second pad 166. The second fan-out portions 164 are electrically connected to the second signal lines 162 and the second pads 166. The second signal lines 162 are disposed between the first substrate 110 and the second substrate 130, and the second fan-out portions 164 are disposed on the second side surface 132 of the second substrate 130.

In FIG. 2, the first substrate 110 may be an array substrate, and has an active region 110A and a peripheral region 110P adjacent to the active region 110A. For example, the peripheral region 110P is located on the periphery of the active region 110A. Scan lines 122 and data lines 124 are located in the active region 110A. The first signal lines 152 of the first peripheral wires 150 and the second signal lines 162 of the second peripheral wires 160 are located in the peripheral region 110P of the first substrate 110. The first signal lines 152 and the second signal lines 162 are connected to the scan lines 122 or the data lines 124. For example, in FIG. 2, both the first signal lines 152 and the second signal lines 162 are connected to the data lines 124. However, in another implementation manner, both the first signal lines 152 and the second signal lines 162 may be connected to the scan lines 122. The present invention is not limited thereto.

In the display panel 100 according to this embodiment, the fan-out portions of the peripheral wires are disposed on the first side surface 112 and the second side surface 132, so as to achieve an effect of a narrow bezel. Specifically, in this embodiment, the signal lines of the peripheral wires are disposed between the first substrate 110 and the second substrate 130, but the fan-out portions of the peripheral wires are no longer disposed between the first substrate 110 and the second substrate 130, so that a width of the peripheral region 110P of the first substrate 110 may be reduced, so as to achieve the effect of a narrow bezel. In addition, the peripheral wires are divided into the first peripheral wires 150 and the second peripheral wires 160. The first fan-out portions 154 of the first peripheral wires 150 are disposed on the first side surface 112 of the first substrate 110, and the second fan-out portions 164 of the second peripheral wires 160 are disposed on the second side surface 132 of the second substrate 130. In this way, a layout area of the first fan-out portions 154 and the second fan-out portions 164 may be reduced, and the first fan-out portions 154 and the second fan-out portions 164 can be manufactured separately on the first substrate 110 and the second substrate 130 that have a limited thickness.

In this embodiment, a plurality of pixel units 128 arranged in an array may be disposed in the active region 110A of the first substrate 110. In this embodiment, the scan lines 122 are intersected with the data lines 124. The pixel units 128 are electrically connected to the scan lines 122 and the data lines 124. The pixel units 128 include active elements 126 and pixel electrodes 127. The active elements 126 are electrically connected to the scan lines 122 and the data lines 124. The first peripheral wires 150 and the second peripheral wires 160 are configured to electrically connect the scan lines 122 or the data lines 124 to an external circuit (for example, a driving chip). Specifically, the first signal lines 152 and the second signal lines 162 may be connected to the data lines 124 (or the scan lines 122), and the first pads 156 and the second pads 166 are connected to the external circuit. In addition, a layout density of the signal lines (that is, the first signal lines 152 and the second signal lines 162) may not meet size design of the external circuit, so the first fan-out portions 154 and the second fan-out portions 164 are configured to adjust the layout density so as to connect to the corresponding external circuit.

In this embodiment, at least one first signal line 152 is disposed between two adjacent second signal lines 162. For example, in FIG. 2, the first signal lines 152 and the second signal lines 162 are alternately arranged. That is, one first signal line 152 is disposed between two adjacent second signal lines 162, and one second signal line 162 is disposed between two adjacent first signal lines 152. In addition, the first signal lines 152 and the second signal lines 162 have equal distances between each other. In FIG. 2, one first signal line 152 and an adjacent second signal line 162 has a distance P1 between each other, the second signal line 162 and the next first signal line 152 has a distance P2 between each other, and a value of the distance P1 is the same as that of the distance P2.

The term "equal distance" used herein is understood to mean spaced at a substantially equal distance along a particular direction. In addition, the term "equal distance" used herein should generally mean that a value is within 5% of a given value or range, or more preferably within 2%. For example, the description of the first signal lines 152 and the second signal lines 162 have equal distances between each other indicates that distances (for example, the distances P1 and P2) between the first signal lines 152 and the second signal lines 162 are the same or slightly different. For example, a ratio of the distance P1 to the distance P2 may be 0.98 to 1.02. For example, if a distance between one first signal line 152 and one second signal line 162 is approximately 210 micrometers, distances ranging from 206 micrometers to 214 micrometers can be referred to as equal distances.

Figure 3:
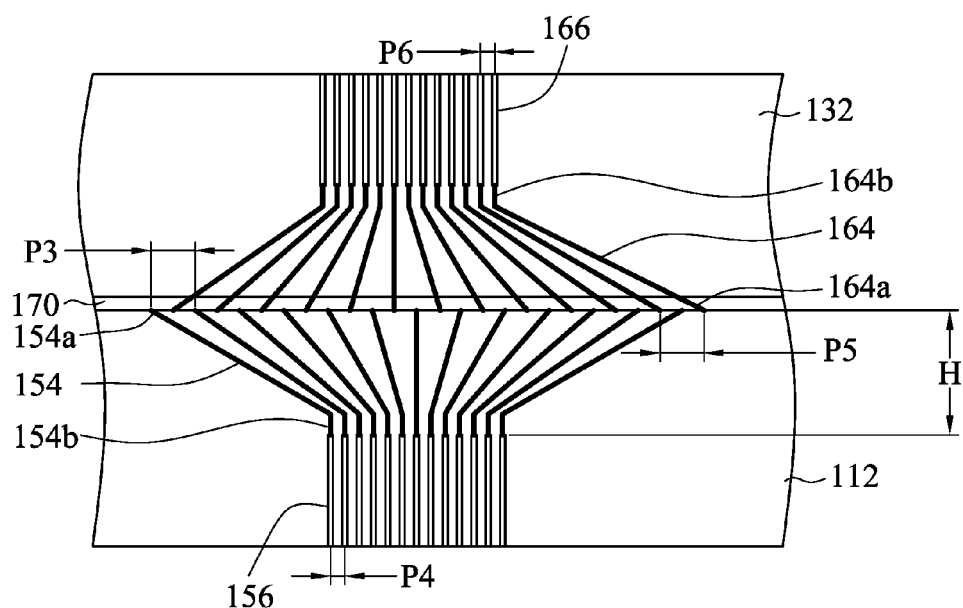
FIG. 3 is a front view of a first side surface and a second side surface in FIG. 1A.

Next, referring to FIG. 3, FIG. 3 is a front view of the first side surface 112 and the second side surface 132 in FIG. 1A. In FIG. 3, the first fan-out portions 154 have first ends 154a and second ends 154b. The first ends 154a of the first fan-out portions 154 are connected to the first signal lines 152 (as shown in FIG. 1A), and the second ends 154b of the first fan-out portions 154 are connected to the first pads 156. A distance P3 between the first ends 154a of two adjacent first fan-out portions 154 is greater than a distance P4 between the second ends 154b. To implement the foregoing structure, the first fan-out portions 154 are designed to be bent. In this embodiment, a value of the distance P3 is equal to a sum of the distances P1 and P2 in FIG. 2. The first fan-out portions 154 are arranged in a convergence manner from the first ends 154a to the second ends 154b. Therefore, the distance P4 between the second ends 154b is less than the distance P3.

In addition, the second fan-out portions 164 have first ends 164a and second ends 164b. The first ends 164a of the second fan-out portions 164 are connected to the second signal lines 162 (as shown in FIG. 1A), and the second ends 164b of the second fan-out portions 164 are connected to the second pads 166. A distance P5 between the first ends 164a of two adjacent second fan-out portions 164 is greater than a distance P6 between the second ends 164b. To implement the foregoing structure, the second fan-out portions 164 are also designed to be bent. In this embodiment, a value of the distance P5 is equal to a sum of the distances P1 and P2 in FIG. 2. That is, the distances P5 and P3 are equal distances. The second fan-out portions 164 are arranged in a convergence manner from the first ends 164a to the second ends 164b. Therefore, the distance P6 between the second ends 164b is less than the distance P5.

Refer to FIG. 1A and FIG. 3. The peripheral wires of the display panel 100 are divided into the first peripheral wires 150 and the second peripheral wires 160. The first fan-out portions 154 are disposed on the first side surface 112, and the second fan-out portions 164 are disposed on the second side surface 132, such that vertical distances between the first ends 154a and the second ends 154b of the first fan-out portions 154 are shortened, vertical distances between the first ends 164a and the second ends 164b of the second fan-out portions 164 are shortened, and wiring layout of the first fan-out portions 154 and the second fan-out portions 164 can be implemented under limited thicknesses of the substrates (that is, a height of the first side surface 112 and a height of the second side surface 132).

For example, in an embodiment, if a display panel 100 has 360 data lines 124 (as shown in FIG. 2), a quantity of first peripheral wires 150 is 180. When a distance P3 between first ends 154a of first fan-out portions 154 is approximately 420 micrometers, a height H of the first fan-out portions 154 (that is, a vertical distance between the first ends 154a and second ends 154b) is approximately 466 micrometers. If a thickness of a first substrate 110 is approximately 500 micrometers to 700 micrometers, the first fan-out portions 154 may be completely disposed on a first side surface 112 of the first substrate 110. Therefore, only first signal lines 152 needs to be performed on a peripheral region 110P (as shown in FIG. 2) of the first substrate 110, so as to meet a requirement for a narrow bezel. However, if the first fan-out portions 154 of all the first peripheral wires 150 and the second fan-out portions 164 of second peripheral wires 160 are disposed on the first side surface 112 of the first substrate 110, a height of the fan-out portions is increased to approximately 915 micrometers, and the first side surface 112 is insufficient to perform wiring layout of the first fan-out portions 154 and the second fan-out portions 164. Consequently, the first fan-out portions 154 and the second fan-out portions 164 need to be disposed in the peripheral region 110P of the first substrate 110, which is unfavorable for design of a narrow bezel for the display panel 100; or the thickness of the first substrate 110 needs to be increased, which is unfavorable for thinning of the display panel 100. In addition, although the above content provides a description by using the first peripheral wires 150 as an example, design of second peripheral wires 160 is similar to that of the first peripheral wires 150, and therefore are not described herein again.

Next, refer to FIG. 3. In this embodiment, the first pads 156 and the second pads 166 are separately disposed on the first side surface 112 and the second side surface 132. Specifically, the first pads 156 are connected to the second ends 154b of the first fan-out portions 154, and the second pads 166 are connected to the second ends 164b of the second fan-out portions 164. Therefore, the first pads 156 may be formed integrally with the first fan-out portions 154, and the second pads 166 may be formed integrally with the second fan-out portions 164. As described above, because the height H of the first fan-out portions 154 is less than a thickness of the first substrate 110, the first pads 156 may be disposed on the first side surface 112. In other words, even if both the first fan-out portions 154 and the first pads 156 are disposed on the first side surface 112, there is no need to increase the thickness of the first substrate 110. Similarly, even if both the second fan-out portions 164 and the second pads 166 are disposed on the second side surface 132, there is no need to increase a thickness of the second substrate 130. In some embodiments, the first pads 156 have equal distances between each other, and the second pads 166 have equal distances between each other.

Next, refer to FIG. 1A and FIG. 3 together. The display panel 100 further includes a sealant 170 that is disposed between the first substrate 110 and the second substrate 130. The sealant is located around the display medium layer 140. The display medium layer 140 may be sealed between the first substrate 110 and the second substrate 130 by using the sealant 170. The first signal lines 152 and the second signal lines 162 are disposed between the sealant 170 and the first substrate 110, the ends of both the first signal lines 152 and the second signal lines 162 are exposed to a side wall of the sealant 170. The second fan-out portions 164 are arranged to the side wall of the sealant 170, so that the second fan-out portions 164 are electrically connected to the second signal lines 162 exposed to the side wall of the sealant 170. In addition, the first fan-out portions 154 are electrically connected to the first signal lines 152 exposed to the side wall of the sealant 170.

In this embodiment, the second substrate 130 may be a counter substrate. The second substrate 130 may include a color filter so as to filter light passing through the display medium layer 140 and generate different colors of light. The display medium layer 140 is configured to change a physical property of image light displayed by the display panel 100. The display medium layer 140 varies according to types of the display panel 100. For example, a display medium layer 140 of a liquid crystal display panel comprises liquid crystal molecules, a display medium layer 140 of an electro-wetting display panel comprises a polar or nonpolar liquid, and a display medium layer 140 of an electrophoretic display panel comprises micro capsules.

Figure 4:
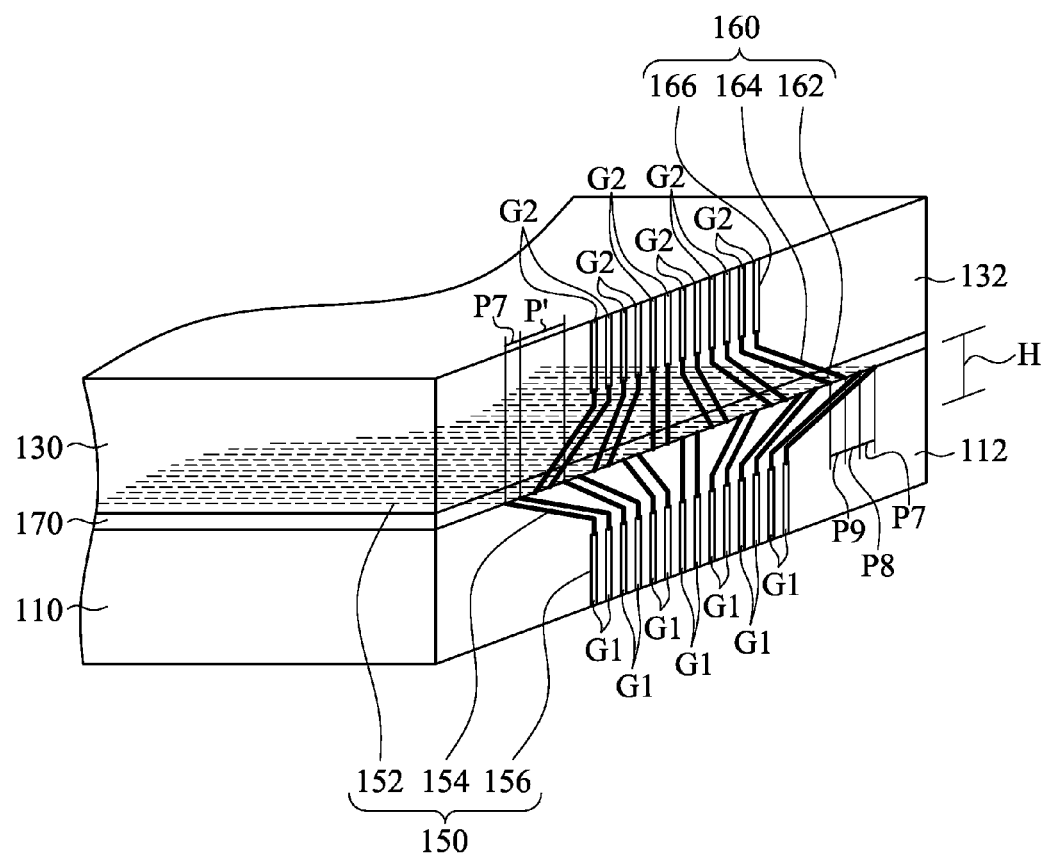
FIG. 4 is a partial three-dimensional view of a display panel according to another embodiment of the present invention.

FIG. 4 is a partial three-dimensional view of a display panel 100A according to another embodiment of the present invention. A difference between this embodiment and the embodiment in FIG. 1A is an arrangement manner of first peripheral wires 150 and second peripheral wires 160. In this embodiment, the first peripheral wires 150 are divided into a plurality of first wire groups G1. Each of the first wire groups G1 has at least two of the first peripheral wires 150. For example, in this embodiment, each of the first wire groups G1 has two first peripheral wires 150, and first signal lines 152 of the first peripheral wires 150 in each of the first wire groups G1 are spaced at equal distances.

The second peripheral wires 160 are divided into a plurality of second wire groups G2. Each of the second wire groups G2 has at least two of the second peripheral wires 160. For example, in this embodiment, each of the second wire groups G2 has two second peripheral wires 160, and second signal lines 162 of the second peripheral wires 160 in each of the second wire groups G2 are spaced at equal distances. In addition, the first wire groups G1 and the second wire groups G2 are alternately arranged on a first substrate 110. There is an equal distance between two adjacent first signal lines 152 or between a first signal line 152 and an adjacent second signal line 162. That is, the two adjacent first signal lines 152 have a distance P7 between each other, the first signal line 152 and the adjacent second signal line 162 have a distance P8 between each other, and the two distances P7 and P8 are the equal distances. Similarly, two adjacent second signal lines 162 have a distance P9 between each other, a second signal line 162 and an adjacent first signal line 152 have a distance P8 between each other, and the two distances P9 and P8 are also the equal distances. In some embodiments, if the display panel 100A has 360 data lines 124 (as shown in FIG. 2), a quantity of the first peripheral wires 150 is 180. When distances P7 between first signal lines 152 are approximately 210 micrometers, and a distance P' between two adjacent first wire groups G1 is approximately 630 micrometers, a height H of first fan-out portions 154 is approximately 479 micrometers, and a first side surface 112 is still sufficient to perform complete wiring of the first fan-out portions 154. Similarly, complete wiring layout of the second fan-out portions 164 can be arranged on the second side surface 132. Other structure details in this embodiment are similar to those in FIG. 1A, and therefore are not described herein again.

Figure 5:
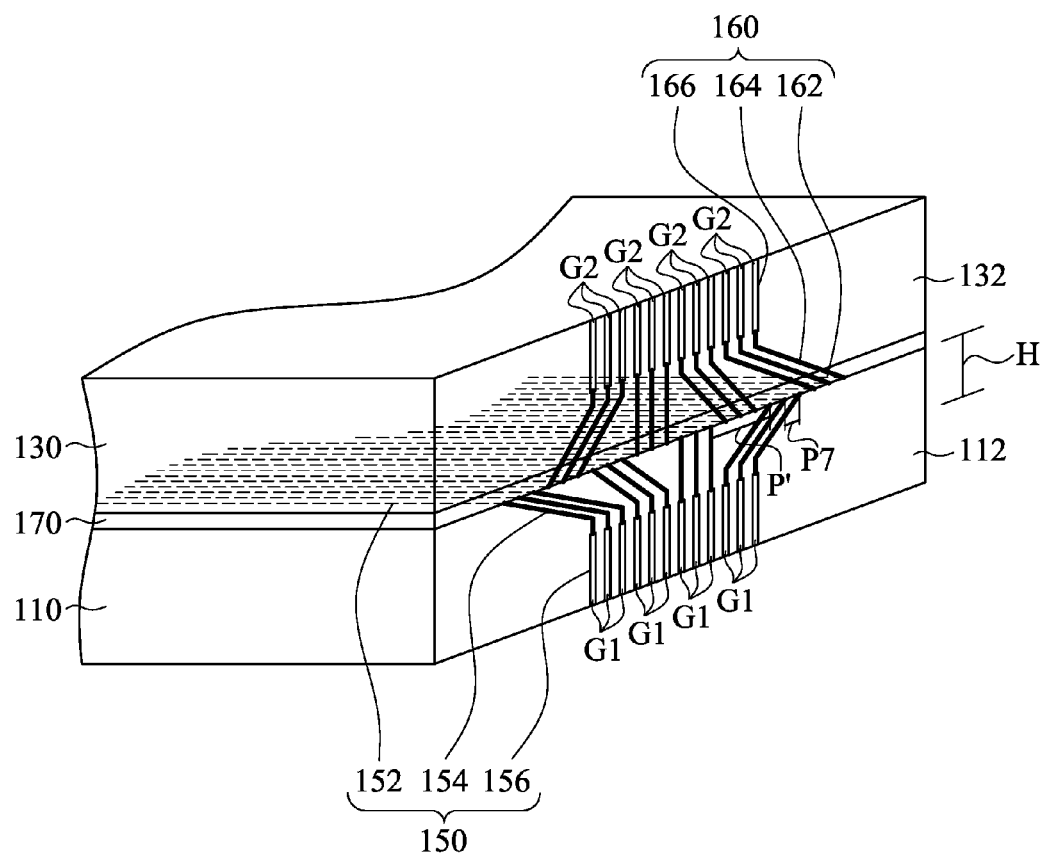
FIG. 5 is a partial three-dimensional view of a display panel according to yet another embodiment of the present invention.

FIG. 5 is a partial three-dimensional view of a display panel 100B according to yet another embodiment of the present invention. A difference between this embodiment and the embodiment in FIG. 4 is an arrangement manner of first peripheral wires 150 and second peripheral wires 160. In this embodiment, each first wire group G1 has three of the first peripheral wires 150, and each second wire group G2 has three of the second peripheral wires 160. If the display panel 100B has 360 data lines 124 (as shown in FIG. 2), a quantity of the first peripheral wires 150 is 180. When distances P7 between first signal lines 152 are approximately 210 micrometers, and a distance P' between two adjacent first wire groups G1 is approximately 840 micrometers, a height H of first fan-out portions 154 is approximately 494 micrometers, and a first side surface 112 is still sufficient to perform complete wiring of the first fan-out portions 154. Similarly, complete wiring layout of the second fan-out portions 164 can be arranged on the second side surface 132. Other structure details in this embodiment are similar to those in FIG. 4, and therefore are not described herein again.

It should be noted that, although a quantity of the first peripheral wires 150 in each first wire group G1 in FIG. 4 and FIG. 5 is the same, in other implementation manners, a quantity of first peripheral wires 150 in each first wire group G1 may be different. For example, there are two first peripheral wires 150 in some first wire groups G1, and there are three first peripheral wires 150 in other first wire groups G1. It should be noted that as long as first peripheral wires 150 may be divided into a plurality of first wire groups G1, and first signal lines 152 of a first wire group G1 and second signal lines 162 of a second wire group G2 are alternately arranged, such first peripheral wires are considered within the scope of the present invention.

Similarly, a quantity of second peripheral wires 160 in each of second wire groups G2 may be different. For example, there are two second peripheral wires 160 in some second wire groups G2, and there are three second peripheral wires 160 in other second wire groups G2. As long as second peripheral wires 160 may be divided into a plurality of second wire groups G2, and second signal lines 162 of a second wire group G2 and first signal lines 152 of a first wire group G1 are alternately arranged, such second peripheral wires are considered within the scope of the present invention.

In addition, a quantity of first peripheral wires 150 in each first wire group G1 and a quantity of second peripheral wires 160 in each second wire group G2 may be the same or different. For example, in FIG. 4, a quantity of the first peripheral wires 150 in each of the first wire groups G1 is the same as that of the second peripheral wires 160 in each of the second wire groups G2 (both the quantities are 2). However, in other embodiments, a quantity of first peripheral wires 150 in each first wire group G1 may be 2, and a quantity of second peripheral wires 160 in each second wire group G2 may be 3. A quantity of peripheral wires in each wire group may be determined according to different embodiments of the invention.

Figure 6:
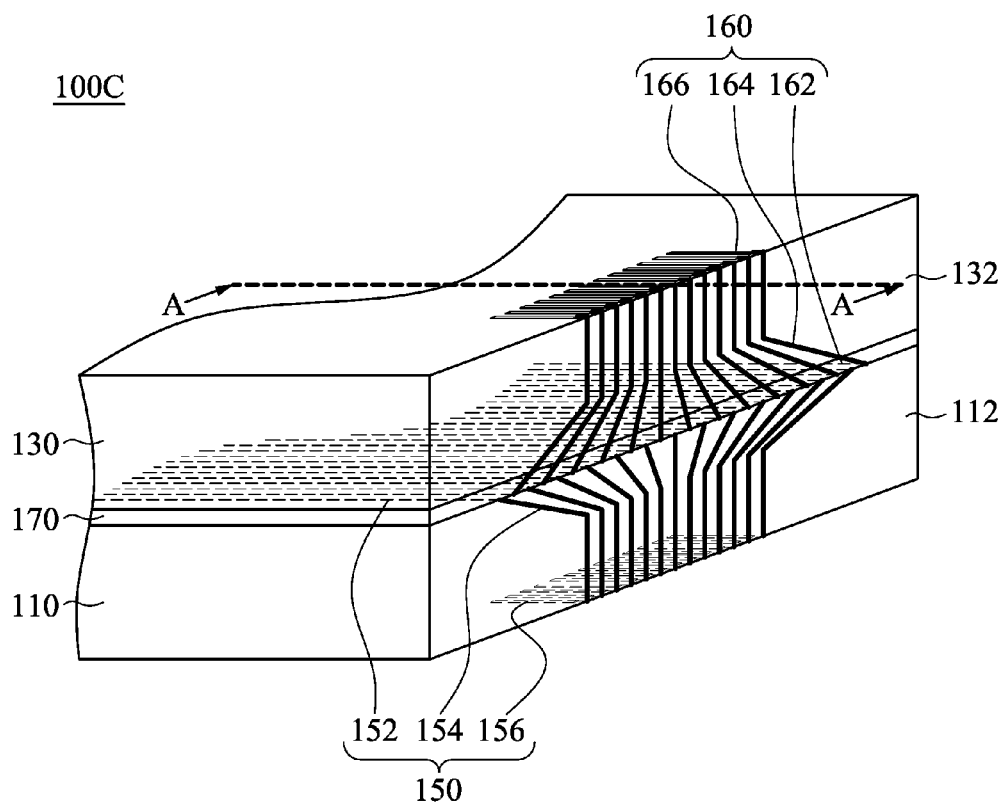
FIG. 6 is a partial three-dimensional view of a display panel according to still another embodiment of the present invention.
Figure 7:
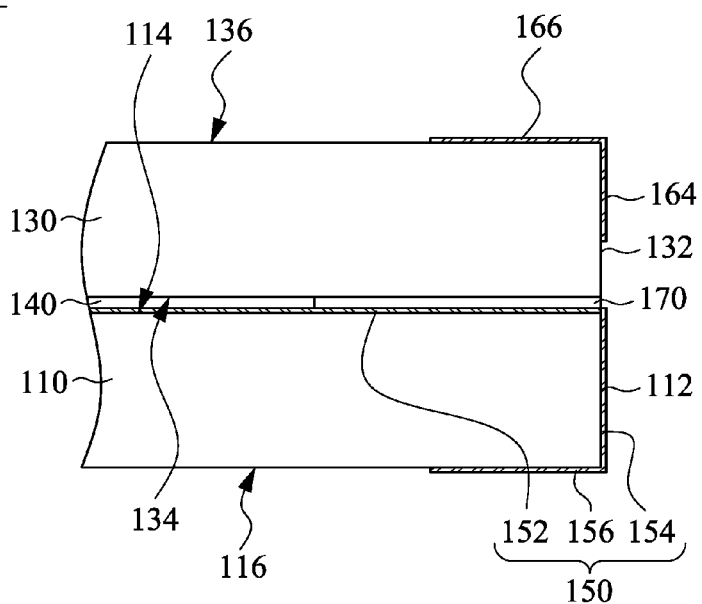
FIG. 7 is a cross section chart of the display panel along a line segment A-A in FIG. 6.

Next, referring to FIG. 6 and FIG. 7 together, FIG. 6 is a partial three-dimensional view of a display panel 100C according to still another embodiment of the present invention, and FIG. 7 is a cross section chart of the display panel 100C along a line segment A-A in FIG. 6. A difference between this embodiment and the embodiment in FIG. 1A is placement positions of first pads 156 and second pads 166. In this embodiment, a first substrate 110 has a first surface 114 and a second surface 116 that are opposite to each other. The first surface 114 faces a display medium layer 140, first signal lines 152 of first peripheral wires 150 are disposed on the first surface 114, and first pads 156 of the first peripheral wires 150 are disposed on the second surface 116. In other words, the first signal lines 152 and the first pads 156 are disposed opposite to each other, and first fan-out portions 154 disposed on a first side surface 112 are connected to the first signal lines 152 and the first pads 156. By using such setting, there is more wiring space for the first fan-out portions 154, or a thickness of the first substrate 110 may be reduced (that is, a height of the first side surface 112 is reduced), which is favorable for thinning of the display panel 100C.

In addition, a second substrate 130 has a first surface 134 and a second surface 136 that are opposite to each other. The first surface 134 faces the display medium layer 140, second signal lines 162 of second peripheral wires 160 are disposed on the first surface 114 of the first substrate 110, and second pads 166 of the second peripheral wires 160 are disposed on the second surface 136. In other words, the second signal lines 162 and the second pads 166 are disposed opposite to each other, and second fan-out portions 164 disposed on a second side surface 132 are connected to the second signal lines 162 and the second pads 166. By using such setting, there is more wiring space for the second fan-out portions 164, or a thickness of the second substrate 130 may be reduced (that is, a height of the second side surface 132 is reduced), which is favorable for thinning of the display panel 100C.

In FIG. 6 and FIG. 7, the first pads 156 and the second pads 166 are separately disposed on the second surface 116 of the first substrate 110 and the second surface 136 of the second substrate 130. However, in other implementation manners, first pads 156 may be disposed on a second surface 116 of a first substrate 110, and second pads 166 may be disposed on a second side surface 132; or first pads 156 may be disposed on a first side surface 112, and second pads 166 may be disposed on a second surface 136 of the second substrate 130. Other structure details in this embodiment are similar to those in FIG. 1A, and therefore are not described herein again.

Figure 8:
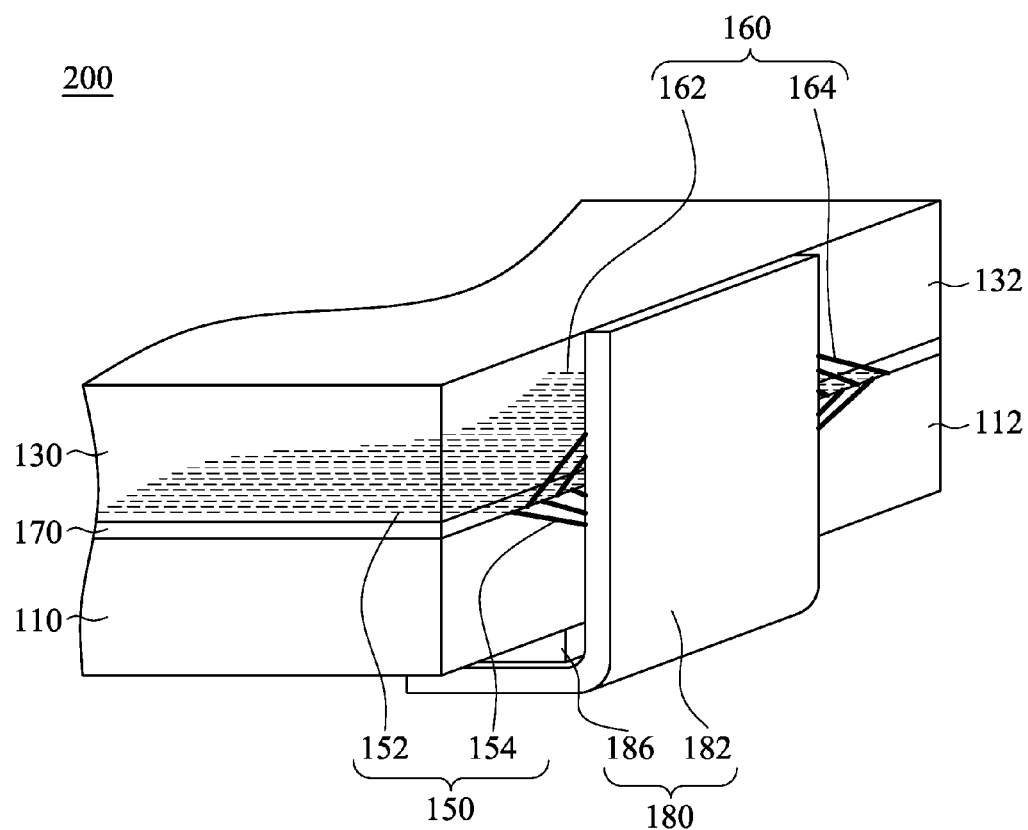
FIG. 8 is a partial three-dimensional view of a display panel according to another embodiment of the present invention.
Figure 9:
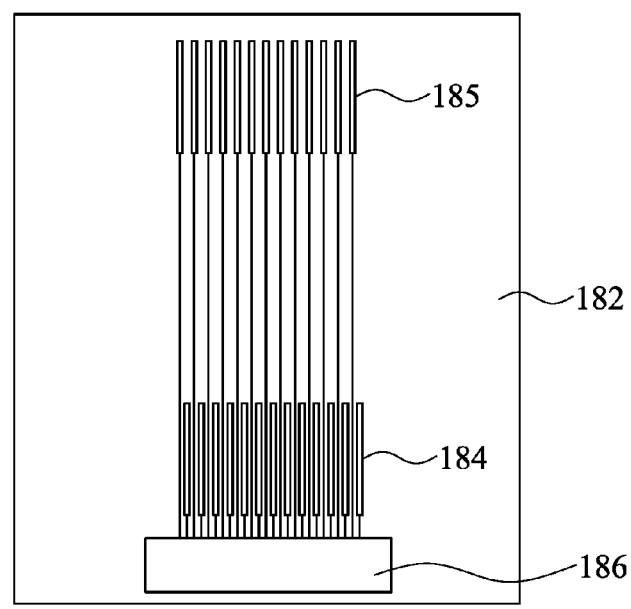
FIG. 9 is a front view of a driving circuit element in FIG. 8.

FIG. 8 is a partial three-dimensional view of a display panel 200 according to another embodiment of the present invention, and FIG. 9 is a front view of a driving circuit element 180 in FIG. 8. In this embodiment, first peripheral wires 150 and second peripheral wires 160 of the display panel 200 are disposed in a same manner as described in FIG. 1A. Therefore, also refer to FIG. 1A together. The display panel 200 further includes at least one driving circuit element 180 that is electrically connected to the first pads 156 and the second pads 166 (as shown in FIG. 1A). Specifically, the driving circuit element 180 includes a circuit board 182 and at least one driving chip 186. The circuit board 182 includes a plurality of connection wires 184 and 185. The connection wires 184 are electrically connected to the first pads 156, and the connection wires 185 are electrically connected to the second pads 166. The driving chip 186 is electrically connected to the connection wires 184 and 185 of the circuit board 182. The connection wires 184 and 185 of the circuit board 182 may be alternately arranged or may be arranged in other suitable manners, and the present invention is not limited thereto. In this way, when the driving circuit element 180 is assembled onto the first substrate 110 and the second substrate 130, end points of the connection wires 184 far away from the driving chip 186 can contact the first pads 156, and end points of the connection wires 185 far away from the driving chip 186 can contact the second pads 166. Therefore, both the first peripheral wires 150 and the second peripheral wires 160 can be electrically connected to the driving chip 186. In addition, the driving chip 186 of the driving circuit element 180 may be bent to the bottom of the first substrate 110. For example, the first substrate 110 and the second substrate 130 are first placed in a frame (not shown), and then the driving chip 186 is bent to the bottom of the frame. However, the present invention is not limited thereto. Other structure details in this embodiment are similar to those in FIG. 1A, and therefore are not described herein again.

Figure 10:
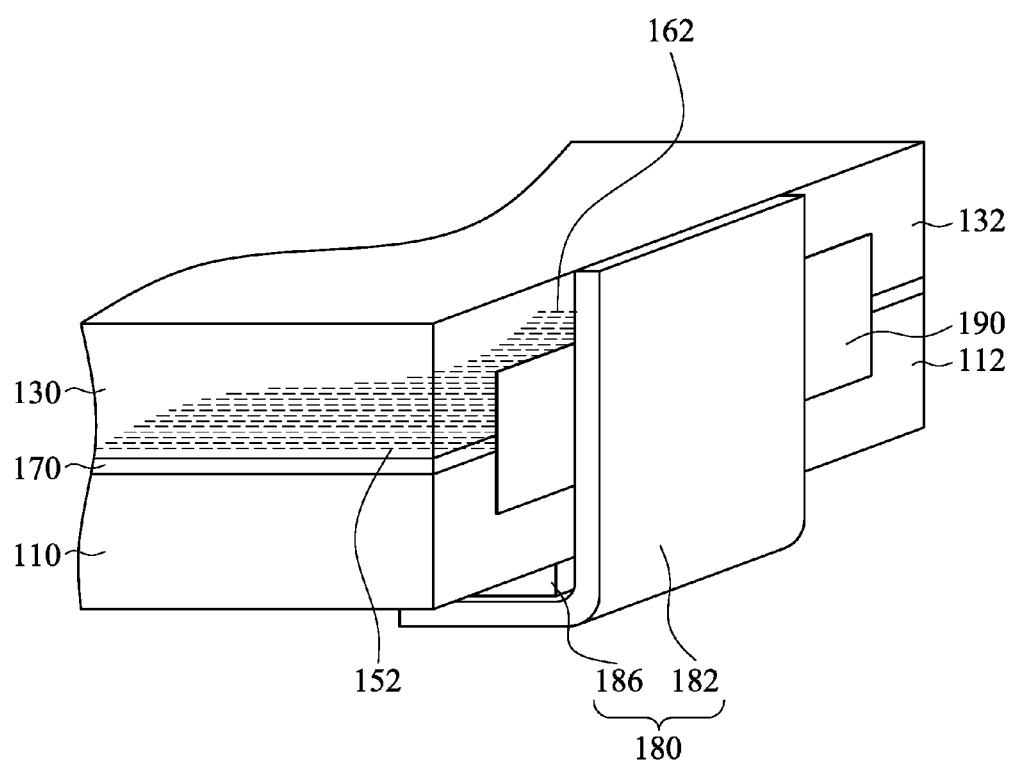
FIG. 10 is a partial three-dimensional view of a display panel according to still another embodiment of the present invention.

FIG. 10 is a partial three-dimensional view of a display panel 300 according to still another embodiment of the present invention. A difference between FIG. 10 and FIG. 8 is existence of an insulation layer 190. In this embodiment, first peripheral wires 150 and second peripheral wires 160 of the display panel 300 are disposed in a same manner as described in FIG. 1A. Therefore, also refer to FIG. 1A together. In FIG. 10, the display panel 300 further includes the insulation layer 190 that is disposed on the first fan-out portions 154 of the first peripheral wires 150 and on the second fan-out portions 164 of the second peripheral wires 160. The insulation layer 190 can insulate the connection wires 185 (as shown in FIG. 9) from the first fan-out portions 154 and the second fan-out portions 164, so as to avoid signal interference caused due to contact between the connection wires 185 and the first fan-out portions 154 as well as the second fan-out portions 164. In some embodiments, an insulation layer 190 may be manufactured on first fan-out portions 154 and second fan-out portions 164 (that is, be manufactured on a first substrate 110 and a second substrate 130). In other embodiments, an insulation layer 190 may also be manufactured on a circuit board 182 of a driving circuit element 180 to cover a portion of the connection wires 185. Other structure details in this embodiment are similar to those in FIG. 8, and therefore are not described herein again.

Figure 11:
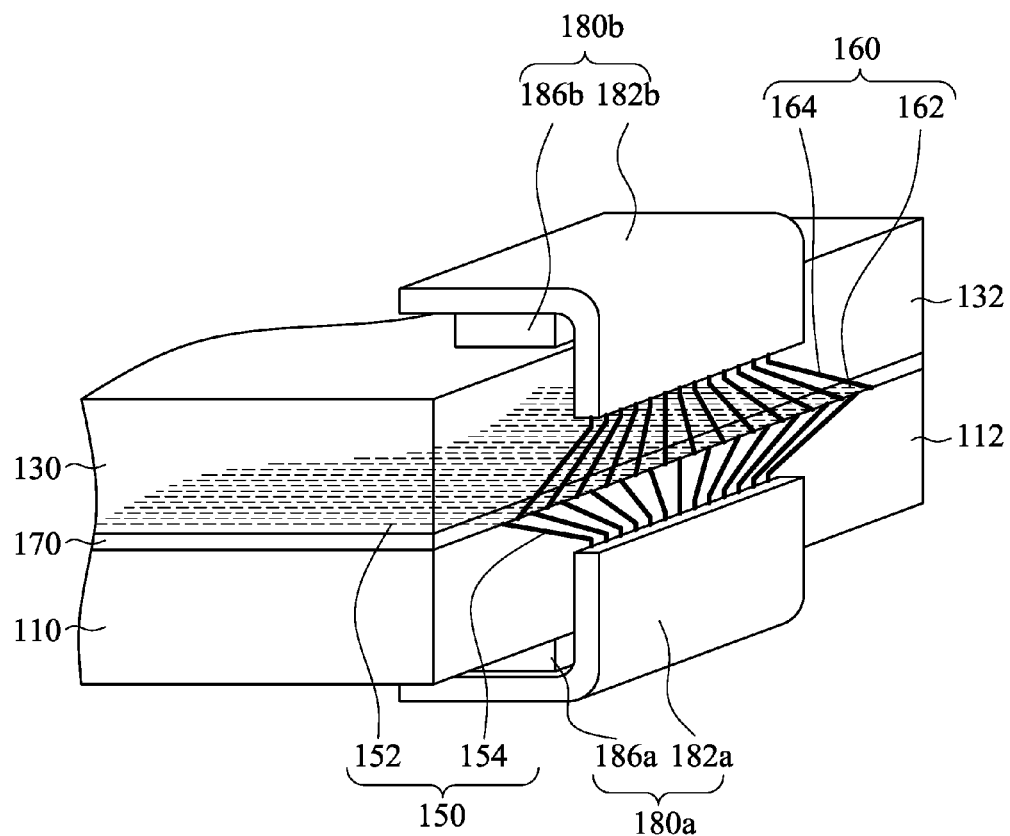
FIG. 11 is a partial three-dimensional view of a display panel according to yet another embodiment of the present invention.

FIG. 11 is a partial three-dimensional view of a display panel 400 according to yet another embodiment of the present invention. In this embodiment, first peripheral wires 150 and second peripheral wires 160 of the display panel 400 are disposed in a same manner as described in FIG. 1A. Therefore, also refer to FIG. 1A together. In FIG. 11, the display panel 400 includes a first driving circuit element 180a and a second driving circuit element 180b. The first driving circuit element 180a is electrically connected to the first pads 156, and the second driving circuit element 180b is electrically connected to the second pads 166. The first driving circuit element 180a includes a circuit board 182a and at least one driving chip 186b, and the second driving circuit element 180b includes a circuit board 182b and at least one driving chip 186b. The driving chip 186a of the first driving circuit element 180a may be bent to the bottom of the first substrate 110, and the driving chip 186b of the second driving circuit element 180b may be bent to the top of the second substrate 130. Other structure details in this embodiment are similar to those in FIG. 8, and therefore are not described herein again.

Figure 12:
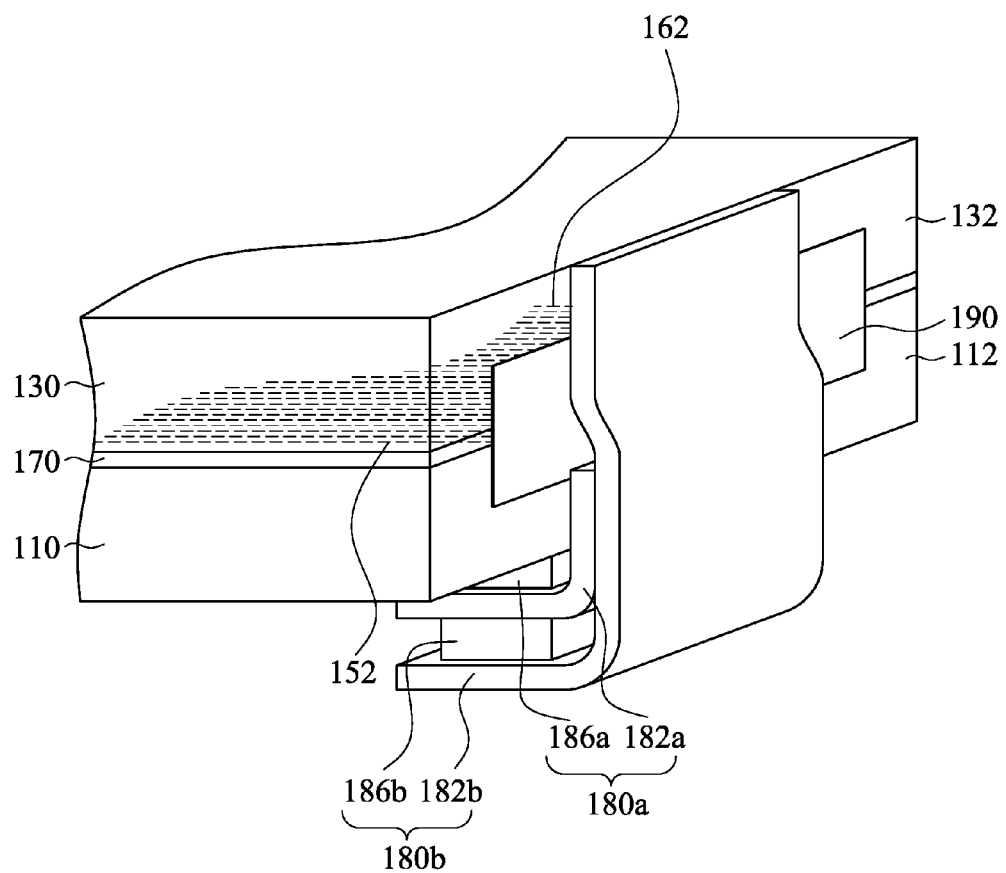
FIG. 12 is a partial three-dimensional view of a display panel according to yet another embodiment of the present invention.

FIG. 12 is a partial three-dimensional view of a display panel 500 according to yet another embodiment of the present invention. Differences between FIG. 12 and FIG. 11 are a placement position of a second driving circuit element 180b and existence of an insulation layer 190. In this embodiment, first peripheral wires 150 and second peripheral wires 160 of the display panel 500 are disposed in a same manner as described in FIG. 1A. Therefore, also refer to FIG. 1A together. In FIG. 12, both a driving chip 186a of a first driving circuit element 180a and a driving chip 186b of a second driving circuit element 180b are bent to the bottom of the first substrate 110. In addition, the display panel 500 may further include the insulation layer 190 that is disposed on the first fan-out portions 154 of the first peripheral wires 150 and on the second fan-out portions 164 of the second peripheral wires 160, so that both the first fan-out portions 154 and the second fan-out portions 164 are insulated from the second driving circuit element 180b. In some embodiments, an insulation layer 190 may be manufactured on first fan-out portions 154 and second fan-out portions 164. In other embodiments, an insulation layer 190 may also be manufactured on a second driving circuit element 180b. Other structure details in this embodiment are similar to those in FIG. 11, and therefore are not described herein again.

It should be noted that, in the foregoing embodiments, although the arrangement manner of the first peripheral wires 150 and the second peripheral wires 160 of the display panels 200 to 500 is shown in FIG. 1A as an example, in other implementation manners, first peripheral wires 150 and second peripheral wires 160 may be arranged in a same manner as that in FIG. 4 and FIG. 5, or may be arranged in other suitable manners. The present invention is not limited thereto.

Figure 13A:
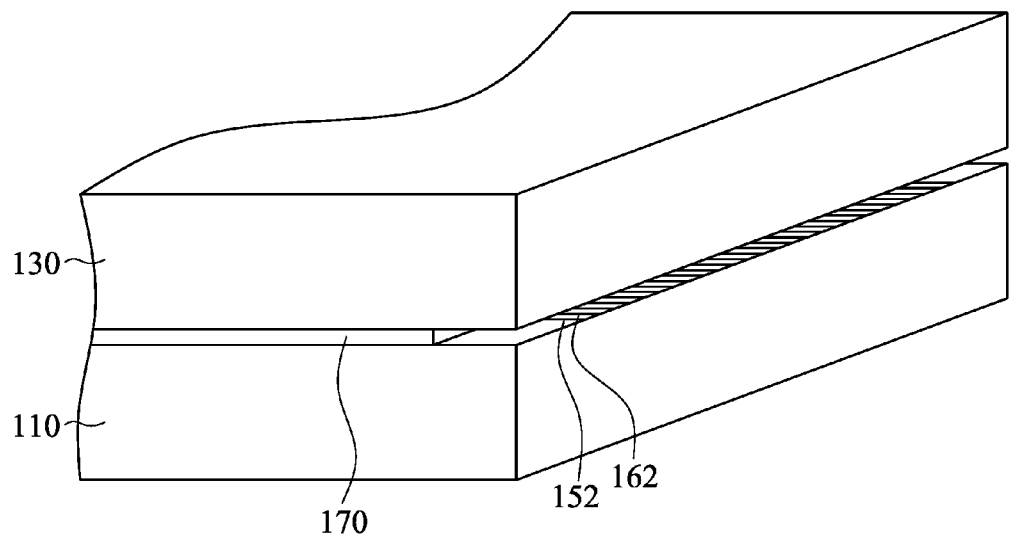
FIG. 13A to FIG. 13E show a method for manufacturing a display panel according to an embodiment of the present invention.

Referring to FIG. 13A to FIG. 13E together, FIG. 13A to FIG. 13E show a method for manufacturing a display panel according to an embodiment of the present invention. Refer to FIG. 13A first. A display medium layer 140 (as shown in FIG. 1B) is formed between a first substrate 110 and a second substrate 130. The display medium layer 140 may include liquid crystal molecules, a polar or nonpolar liquid, or micro capsules, which depends on a type of the display panel. A sealant 170 is utilized to bond the first substrate 110 and the second substrate 130. The sealant 170 is located around the display medium layer 140. The display medium layer 140 may be sealed between the first substrate 110 and the second substrate 130 by using the sealant 170. In this embodiment, the first substrate 110 may be an array substrate, and a plurality of first signal lines 152 and a plurality of second signal lines 162 are disposed on the first substrate 110. The second substrate 130 may be a counter substrate having a color filter. For example, the sealant 170 may be made of a thermosetting adhesive, a photo-curing adhesive, or another suitable material.

Figure 13B:
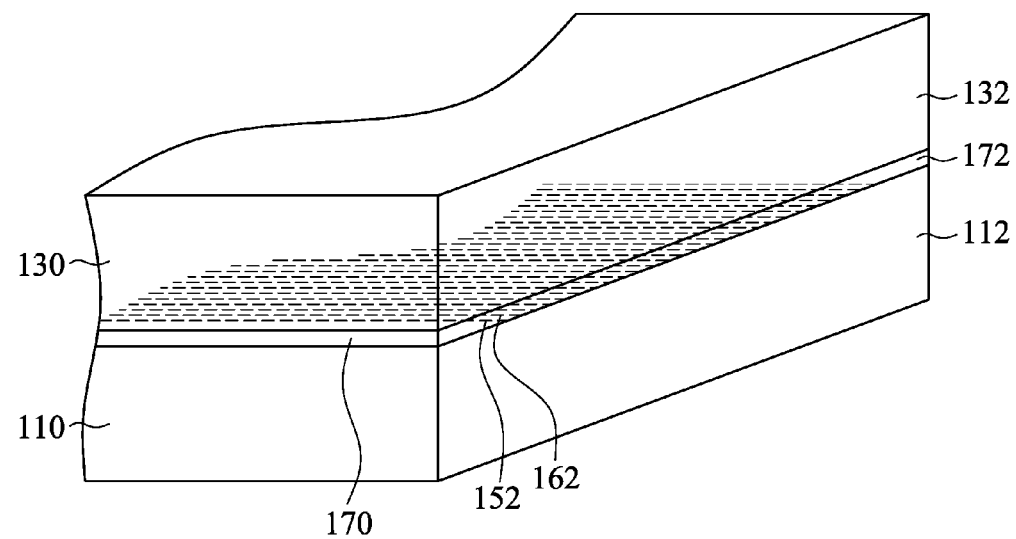

Next, refer to FIG. 13B. A part of the first substrate 110 and a part of the second substrate 130 are removed, so that a first side surface 112 of the first substrate 110, a second side surface 132 of the second substrate 130, and a side surface 172 of the sealant 170 are substantially aligned. Therefore, ends of the first signal lines 152 and ends of the plurality of second signal lines 162 are exposed from the side surface 172 of the sealant 170. In some embodiments, a physical grinding manner may be used to grind a first substrate 110 and a second substrate 130, so as to remove a part of the first substrate 110 and a part of the second substrate 130. However, the present invention is not limited thereto.

Figure 13C:
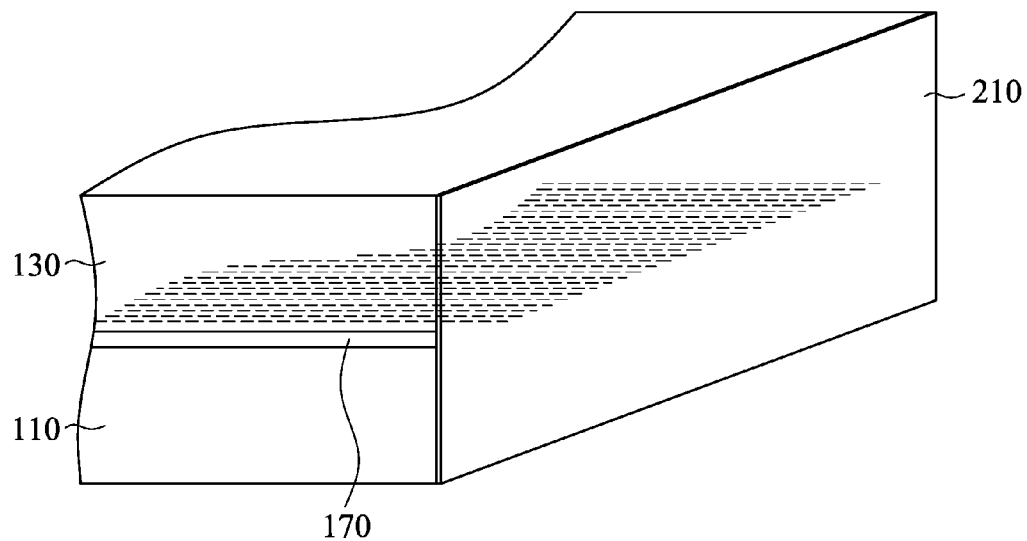

Next, refer to FIG. 13C. A conductive layer 210 is formed on the first side surface 112 of the first substrate 110 and the second side surface 132 of the second substrate 130. The conductive layer 210 may be made of a conductive sliver adhesive, a sliver paste, or another suitable material. The conductive layer 210 may be formed on the first side surface 112 and the second side surface 132 through a coating or pasting manner.

Figure 13D:
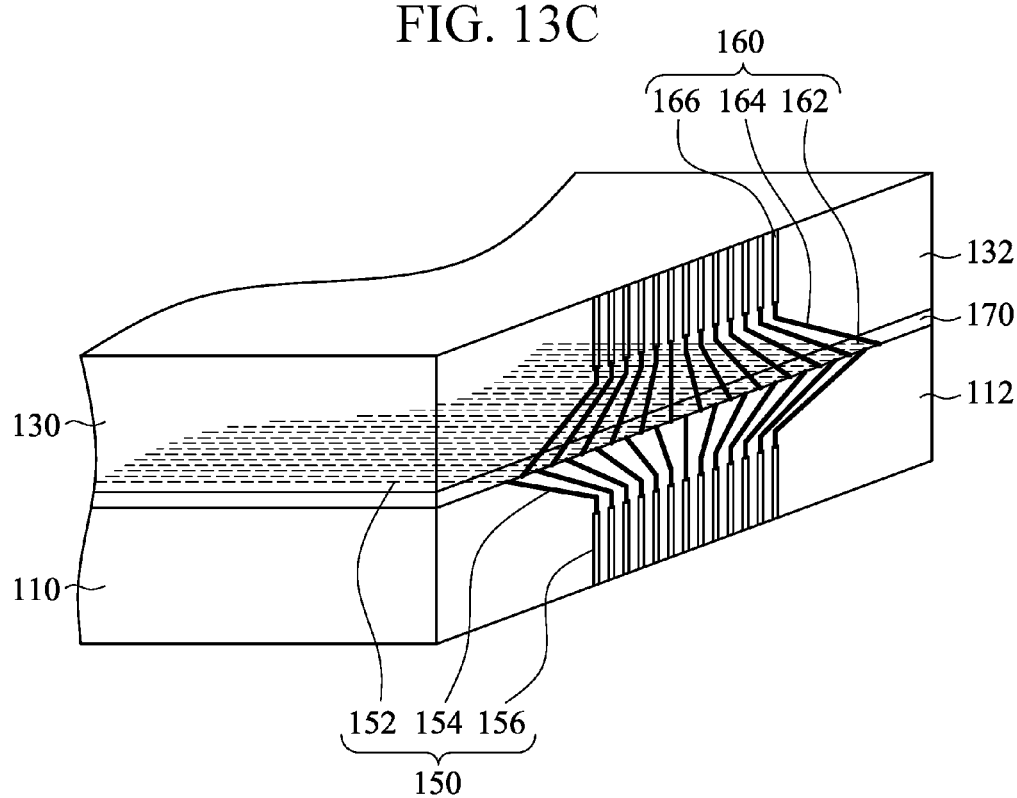

Next, refer to FIG. 13D. The conductive layer 210 in FIG. 13C is patterned, first fan-out portions 154 are formed on the first side surface 112 of the first substrate 110, and second fan-out portions 164 are formed on the second side surface 132 of the second substrate 130. The first fan-out portions 154 are connected to the first signal lines 152, and the second fan-out portions 164 are connected to the second signal lines 162. In some embodiments, laser engraving may be utilized to pattern the conductive layer 210. In addition, at this stage, first pads 156 may be formed on the first side surface 112, and second pads 166 may be formed on the second side surface 132. In other words, the first pad 156 of each first peripheral wire 150 is formed integrally with the first fan-out portion 154, and the second pad 166 of each second peripheral wire 160 is formed integrally with the second fan-out portion 164.

According to different arrangement manners of the first peripheral wires 150 and the second peripheral wires 160, a pattern type formed by patterning at this stage is not limited to FIG. 13D. A person of ordinary skill in the art can flexibly design a pattern type of patterning (for example, a pattern type in FIG. 4 or FIG. 5) according to different embodiments of the invention. In addition, in this embodiment, the first fan-out portions 154, the second fan-out portions 164, the first pads 156, and the second pads 166 are formed by first coating and then patterning the conductive layer 210. However, in other embodiments, a patterned conductive layer may be directly attached to a first side surface 112 and a second side surface 132, to form a structure in FIG. 13D.

Figure 13E:
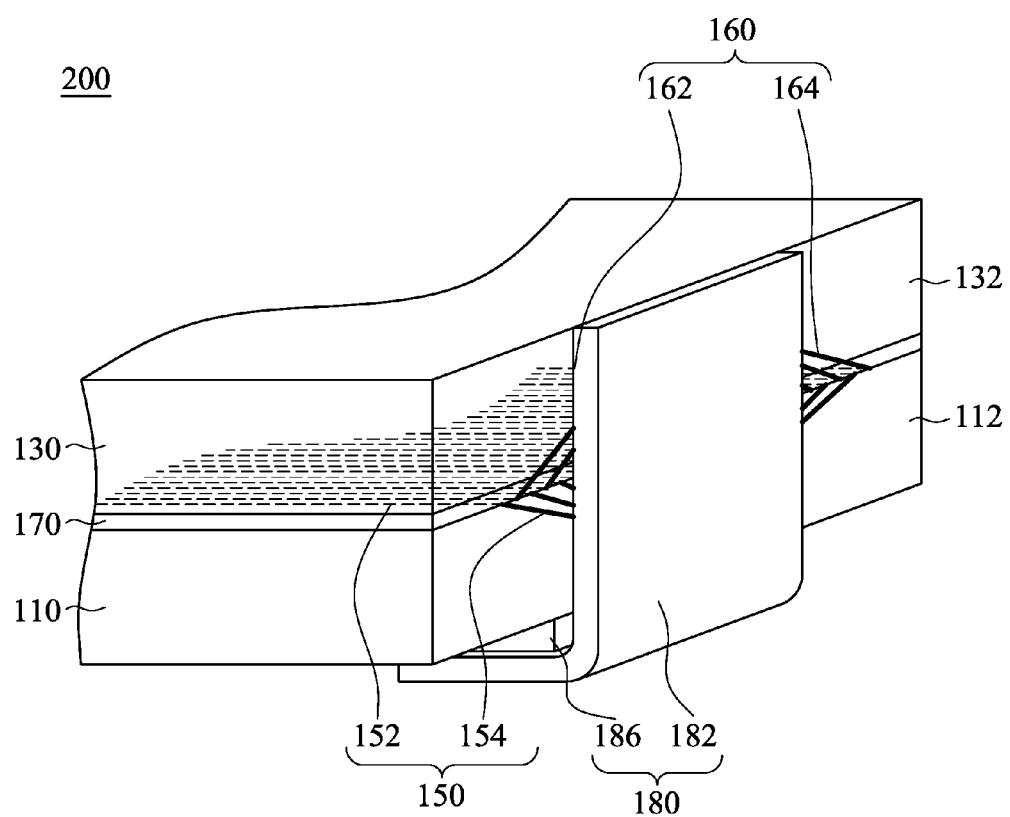

Next, refer to FIG. 13E. Next, at least one driving circuit element 180 is electrically connected to the first pads 156 and the second pads 166, so that the first peripheral wires 150 and the second peripheral wires 160 may be electrically connected to a driving chip 186 of the driving circuit element 180. In some embodiments, a driving circuit element 180 may be attached to first pads 156 and second pads 166 by utilizing an anisotropic conductive film (ACF) or another suitable conductive adhesive. Thereafter, the display panel 200 shown in FIG. 8 is completed. Display panels (for example, the display panels 100, 100A to 100C, and 300 to 500) in other embodiments of the present invention may be formed by using the foregoing method.

In some embodiments, before the step of FIG. 13E is performed, an insulation layer may be first formed on the first side surface 112 and the second side surface 132, so as to cover the first fan-out portions 154 and the second fan-out portions 164. Alternatively, an insulation layer may be first formed on the driving circuit element 180, so as to insulate the first fan-out portions 154 and the second fan-out portions 164 from the driving circuit element 180.

The present invention is disclosed through the foregoing implementation manners. However, these implementation manners are not intended to limit the present invention. Various changes and modifications can be made by a person skilled in the art without departing from the spirit and scope of the present invention. Therefore, the protection scope of the present invention is subject to the appended claims.

What is claimed is:

1. A display panel, comprising:
   a first substrate, having at least one first side surface;
   a second substrate, disposed opposite to the first substrate, and having at least one second side surface adjacent to the first side surface;
   a display medium layer, disposed between the first substrate and the second substrate;
   a plurality of first peripheral wires, each of the first peripheral wires comprising a first signal line, a first pad, and a first fan-out portion that is electrically connected to the first signal line and the first pad, wherein the first signal lines are disposed between the first substrate and the second substrate, and the first fan-out portions are disposed on the first side surface of the first substrate; and
   a plurality of second peripheral wires, each of the second peripheral wires comprising a second signal line, a second pad, and a second fan-out portion that is electrically connected to the second signal line and the second pad, wherein the second signal lines are disposed between the first substrate and the second substrate, and the second fan-out portions are disposed on the second side surface of the second substrate.

2. The display panel according to claim 1, wherein at least one of the first signal lines is disposed between two adjacent second signal lines.

3. The display panel according to claim 1, wherein the first signal lines and the second signal lines are alternately arranged.

4. The display panel according to claim 1, wherein the first peripheral wires are divided into a plurality of first wire groups, each of the first wire groups has at least two of the first peripheral wires, the second peripheral wires are divided into a plurality of second wire groups, each of the second wire groups has at least two of the second peripheral wires, and the first wire groups and the second wire groups are alternately arranged.

5. The display panel according to claim 4, wherein the first signal lines of the first peripheral wires in each of the first wire groups are spaced at equal distances, and the second signal lines of the second peripheral wires in each of the second wire groups are spaced at equal distances.

6. The display panel according to claim 4, wherein a quantity of the first peripheral wires in each of the first wire groups is the same as a quantity of the second peripheral wires in each of the second wire groups.

7. The display panel according to claim 1, wherein the first signal lines and the second signal lines are spaced apart from each other at equal distances.

8. The display panel according to claim 1, wherein the first pads have equal distances between each other.

9. The display panel according to claim 1, wherein
   each of the first fan-out portions has a first end and a second end, the first end of each of the first fan-out portions is connected to the corresponding first signal line, and the second end of each of the first fan-out portions is connected to the corresponding first pad, wherein a distance between the first ends of two adjacent first fan-out portions is greater than a distance between the second ends of the two adjacent first fan-out portions; and each of the second fan-out portions has a first end and a second end, the first end of each of the second fan-out portions is connected to the corresponding second signal line, and the second end of each of the second fan-out portions is connected to the corresponding second pad, wherein a distance between the first ends of two adjacent second fan-out portions is greater than a distance between the second ends of the two adjacent second fan-out portions.

10. The display panel according to claim 1, wherein the first pads are disposed on the first side surface of the first substrate.

11. The display panel according to claim 10, wherein the second pads are disposed on the second side surface of the second substrate.

12. The display panel according to claim 1, wherein the first substrate and the second substrate respectively have a first surface and a second surface, the display medium layer is disposed between the first surface of the first substrate and the first surface of the second substrate, and the first pads are disposed on the second surface of the first substrate.

13. The display panel according to claim 12, wherein the second pads are disposed on the second surface of the second substrate.

14. The display panel according to claim 1, further comprising a sealant, disposed between the first substrate and the second substrate, and located around the display medium layer, wherein the first signal lines and the second signal lines are disposed between the sealant and the first substrate.

15. The display panel according to claim 14, wherein the second fan-out portions are further disposed on the sealant.

16. The display panel according to claim 1, further comprising at least one driving circuit element, electrically connected to the first pads and the second pads.

17. The display panel according to claim 16, wherein the at least one driving circuit element comprises:
    a circuit board, comprising a plurality of connection wires, electrically connected to the first pads and the second pads respectively; and
    a driving chip, electrically connected to the connection wires of the circuit board.

18. The display panel according to claim 1, further comprising:
    a first driving circuit element, electrically connected to the first pads; and
    a second driving circuit element, electrically connected to the second pads.

19. The display panel according to claim 1, further comprising an insulation layer, disposed on the first fan-out portions of the first peripheral wires and disposed on the second fan-out portions of the second peripheral wires.

* * * * *